United States Patent
Okesaku et al.

(10) Patent No.: US 10,280,121 B2
(45) Date of Patent: May 7, 2019

(54) SILICON CARBIDE MEMBER FOR PLASMA PROCESSING APPARATUS

(71) Applicant: HOKURIKU SEIKEI INDUSTRIAL CO., LTD., Ishikawa (JP)

(72) Inventors: Masahiro Okesaku, Ishikawa (JP); Michito Miyahara, Ishikawa (JP); Hideo Eto, Mie (JP); Yukio Okudo, Mie (JP); Makoto Saito, Ishikawa (JP); Hiroshi Sanda, Ishikawa (JP)

(73) Assignee: HOKURIKU SEIKEI INDUSTRIAL CO., LTD., Ishikawa (JP)

( * ) Notice: Subject to any disclaimer, the term of this patent is extended or adjusted under 35 U.S.C. 154(b) by 0 days.

(21) Appl. No.: 15/562,104

(22) PCT Filed: Mar. 30, 2016

(86) PCT No.: PCT/JP2016/060502
§ 371 (c)(1),
(2) Date: Sep. 27, 2017

(87) PCT Pub. No.: WO2016/159146
PCT Pub. Date: Oct. 6, 2016

(65) Prior Publication Data
US 2018/0072629 A1  Mar. 15, 2018

(30) Foreign Application Priority Data
Mar. 31, 2015  (JP) .................... 2015-072538

(51) Int. Cl.
*C04B 35/575* (2006.01)
*H01L 21/3065* (2006.01)
(Continued)

(52) U.S. Cl.
CPC ........ *C04B 35/5755* (2013.01); *C04B 35/565* (2013.01); *C04B 35/575* (2013.01);
(Continued)

(58) Field of Classification Search
CPC ..................... C04B 35/565; C04B 35/5755
See application file for complete search history.

(56) References Cited

U.S. PATENT DOCUMENTS 5,016,610 A * 5/1991 Meguro ............... C04B 35/565
126/91 A
5,656,218 A * 8/1997 Lin .................... C04B 35/565
264/656

(Continued)

FOREIGN PATENT DOCUMENTS

JP  07157367 A  * 6/1995
JP  10-120466     5/1998

(Continued)

OTHER PUBLICATIONS

International Preliminary Report on Patentability dated Oct. 3, 2017 for PCT/JP2016/060502 filed Mar. 30, 2016.

(Continued)

*Primary Examiner* — Karl E Group
(74) *Attorney, Agent, or Firm* — Paul D. Bianco; Katherine Davis; Fleit Gibbons Gutman Bongini & Bianco PL (57) ABSTRACT

A silicon carbide member for a plasma processing apparatus is obtained by mixing an α-silicon carbide powder having an average particle size of 0.3 to 3 μm, with an amount of metal impurities in the α-silicon carbide powder reduced to 20 ppm or less, and a sintering aid comprising $B_4C$ in amount of 0.5 to 5 weight parts or $Al_2O_3$ and $Y_2O_3$ in total amount of 3 to 15 weight parts; sintering a mixture of the α-silicon carbide powder and the sintering aid in an argon atmosphere furnace or a high-frequency dielectric heating furnace; and then processing the resulting sintered body. The resulting silicon carbide member for a plasma processing apparatus is low cost and durable.

1 Claim, 5 Drawing Sheets (51) Int. Cl.
  *C04B 35/565* (2006.01)
  *C04B 35/626* (2006.01)
  *C04B 35/63* (2006.01)
  *C04B 35/645* (2006.01)

(52) U.S. Cl.
  CPC .... *C04B 35/62695* (2013.01); *C04B 35/6303* (2013.01); *C04B 35/645* (2013.01); *H01L 21/3065* (2013.01); *C04B 2235/3217* (2013.01); *C04B 2235/3222* (2013.01); *C04B 2235/3225* (2013.01); *C04B 2235/383* (2013.01); *C04B 2235/3821* (2013.01); *C04B 2235/5436* (2013.01); *C04B 2235/5445* (2013.01); *C04B 2235/604* (2013.01); *C04B 2235/658* (2013.01); *C04B 2235/666* (2013.01); *C04B 2235/667* (2013.01); *C04B 2235/725* (2013.01); *C04B 2235/77* (2013.01); *C04B 2235/85* (2013.01)

(56) References Cited

U.S. PATENT DOCUMENTS 5,942,454 A    8/1999   Nakayama et al.
5,998,318 A *  12/1999  Takanami ............. C04B 35/565
                                                      501/100
7,150,850 B2 * 12/2006  Odaka ................... C04B 35/575
                                                      264/682
2004/0259717 A1  12/2004  Odaka

FOREIGN PATENT DOCUMENTS

| JP | 11-217268 | 8/1999 |
| JP | 2001-007082 | 1/2001 |
| JP | 2001-203192 | 7/2001 |
| JP | 2003-095744 | 4/2003 |
| JP | 2003-176178 | 6/2003 |
| JP | 2005-267931 | 9/2005 |
| JP | 2007-112641 | 5/2007 |
| JP | 2008074667 A * | 4/2008 |
| JP | 2011-506251 A | 3/2011 |
| WO | 2003-040059 A | 5/2003 |

OTHER PUBLICATIONS

Written Opinion for PCT/JP2016/060502 filed Mar. 30, 2016.
International Search Report dated Apr. 18, 2016 for PCT/JP2016/060502 filed Mar. 30, 2016.
Written Opinion dated May 17, 2016 for PCT/JP2016/060502 filed Mar. 30, 2016.

* cited by examiner

SILICON CARBIDE MEMBER FOR PLASMA PROCESSING APPARATUS

TECHNICAL FIELD

The present invention relates to a silicon carbide member for a plasma processing apparatus designed to manufacture various semiconductor devices, and a method of producing the silicon carbide member.

BACKGROUND ART

Heretofore, in a manufacturing process of a semiconductor device, plasma processing techniques have been used to perform film-forming and etching for a semiconductor wafer.

Figure 1:
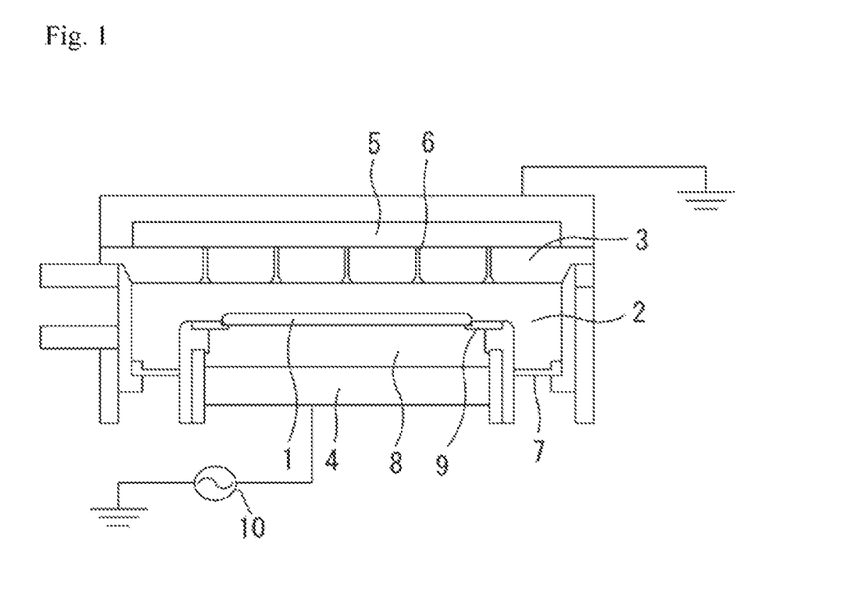
FIG. 1 is a sectional view of a reactive ion etching apparatus.

FIG. 1 is a sectional view of a reactive ion etching (RIE) apparatus which comprises a reaction chamber 2 for subjecting a semiconductor wafer 1 to etching, and a showerhead type upper electrode 3 and a lower electrode 4 arranged, respectively, on upper and lower sides of the reaction chamber 2 in opposed relation to each other.

As a principle, when an etching gas is supplied into the reaction chamber 2, and electric power is applied from a high-frequency power supply 10 to the lower electrode 4, plasma is generated in the reaction chamber 2. In the case where the RIE apparatus is a parallel plate-type RIE apparatus as depicted in FIG. 1, upon application of electric power from the high-frequency power supply 10 to the lower electrode 4, a self-bias potential is generated between the semiconductor wafer 1 and the plasma, and active species such as ions and radicals in the plasma are accelerated in a direction toward the semiconductor wafer 1 (direction perpendicular to a wafer surface). The active species can etch (anisotropically etch) the semiconductor wafer 1 only in the direction perpendicular to the wafer surface, based on a physical effect and a chemical reaction effect of sputtering, thereby enabling high-accuracy microprocessing.

In operation of etching the semiconductor wafer 1, an internal space of the reaction chamber 2 is first evacuated to a vacuum state by a vacuum pump (not depicted) connected to an downstream side of an exhaust plate 7, and the etching gas is supplied from the shower head type upper electrode 3.

The showerhead type upper electrode 3 is composed of a disk-shaped member having a hollow portion 5, and comprising a lower wall formed with a large number of gas supply holes 6 in a showerhead-like arrangement. The etching gas is supplied from an etching gas supply source (not depicted) to the hollow portion 5 and then supplied into the reaction chamber 2 through the gas supply holes 6 in a uniform flow rate distribution.

After the supply of the etching gas, electric power is applied from the high-frequency power supply 10 to the lower electrode 4, so that plasma is generated in the reaction chamber 2. The semiconductor wafer 1 is etched by active species in the plasma.

The semiconductor wafer 1 is electrostatically-attracted and held by a disc-shaped electrostatic chuck 8 (ESC) provided on an upper side of the lower electrode 4, and an annular edge ring 9 is provided around an upper surface of the electrostatic chuck 8. The edge ring 9 is provided as a means to adjust an electric field to prevent the active species from being deflected by an outer periphery of the semiconductor wafer 1 with respect to a vertical direction (the direction perpendicular to the wafer surface) during the etching of the semiconductor wafer 1.

Patent Document 1 (JP 2007-112641 A) describes a technique intended to provide a focus ring (edge ring) having plasma resistance to high-density plasma, wherein the focus ring is formed of a sintered composite obtained by: adding an organic binder to an mixed powder of yttria powder and aluminum powder; kneading and forming the resulting mixture to prepare a shaped body; and then burning the shaped body in a hydrogen or inert atmosphere at a temperature of 1520° C. or less, wherein the focus ring has a specific resistance (electric resistivity) of less than $10^9$ Ω·cm.

Patent Document 2 (JP H11-217268A) describes a SiC sintered body for a plasma apparatus, which exhibits excellent plasma resistance and has a low risk of particle contamination due to drop-off of particles, wherein the SiC sintered body has a density of 2.7 g/cm$^3$ or more, an average crystal grain size of 20 μm or more, a thermal conductivity of 80 W/m·K or more, and an electric resistivity of $10^{-2}$ to $10^2$ Ω·cm. Although the Patent Document 2 discloses sintered bodies using α-SiC as a primary raw material, in Examples 3 and 5, it also discloses sintered bodies using β-SiC as a primary raw material in detail in Examples 1, 2 and Comparative Examples 1, 2 with detailed description. As regards the sintered bodies using α-SiC as a primary raw material, properties thereof are not shown, except for the matters described in Table 1. Specifically, as to a content rate of free carbon, Table 1 presents higher values than those of the remaining Examples and Comparative Examples, and, as to electric resistivity, presents relatively high values, specifically, 0.4 Ω·cm in Example 3 and 5.0 Ω·cm in Example 5. Thus, the sintered bodies in Examples 3 and 5 are not formed to have particularly excellent properties.

Moreover, although the sintered body in Example 3 is sintered at a highest temperature of 2400° C., the density thereof is 3.1 g/cm$^3$ at most, and the crystal grain size is less than those of Examples 1 and 2. Thus this sintered body is more likely to be charged with electric charges, and is thus inferior in plasma resistance.

Patent Document 3 (JP 2003-095744A) includes the following descriptions in paragraph [0008]: "as shown in Sample No. 2 to Sample No. 13, the silicon carbide sintered body of the present invention is understand to be a sintering material which is excellent in strength and hardness based on a dense and substantially pore-free microstructure over which a YAG phase is finely dispersed." (lines 31 to 34 of 5th column); and "When a semiconductor-producing member using the silicon carbide sintered body of the present invention in each of Sample Nos. 2 to 13 and Sample Nos. 16 and 17 was mounted on a semiconductor-manufacturing device, diffuse reflection due to pores was remarkably suppressed, so that device accuracy was improved and improvement in semiconductor manufacturing efficiency was ascertained." (lines 35 to 39 of 6th column). However, as described in the paragraph [0008] as follows: "crystal regions of silicon carbide exhibited substantially the same physical property values, irrespective of which of α phase, β phase and α+β composite phase each of the crystal regions has" (lines 36 to 38 of 5th column), Patent Document 3 makes no mention of recognition that the sintered body made of the α-phase silicon carbide crystal phase is particularly excellent.

Further, recently, an edge ring formed of silicon carbide (hereinafter referred to as "SiC") having high plasma resistance has become widespread. In this regard, with a view to preventing metal contamination in the reaction chamber 2, high-purity SiC prepared by a chemical vapor deposition (CVD) process, or a sintered body obtained by hot-pressing a SiC powder prepared by a CVD process, is employed, and a primary raw material thereof is β-structure silicon carbide (hereinafter referred to as "β-SiC").

The SiC member using α-silicon carbide (hereinafter referred to as "α-SiC") as a primary raw material has been considered to cause chamber contamination, because it contains metal impurities such as iron in an amount greater than those in the SiC member prepared by CVD process using β-SiC as a primary raw material. For this reason, an idea of using α-SiC as a raw material for a member for a plasma processing apparatus has been unlikely to be created, and plasma resistance of α-SiC has not been checked in detail.

CITATION LIST

Parent Document

Patent Document 1: JP 2007-112641A
Patent Document 2: JP H11-217268A
Patent Document 3: JP 2003-095744A

SUMMARY OF INVENTION

Technical Problem

The edge ring described in the Patent Document 1 has a very large specific resistance (electric resistivity) of less than 109 Ω·cm, and no verification about impurity diffusion has been made. Moreover, it is also not clear whether or not plasma resistance of the edge ring in the Patent Document 1 is superior to that of an edge ring formed of SiC.

Although an edge ring formed of SiC has excellent properties in terms of plasma resistance, purity and the like, as compared with an edge ring formed of polysilicon, $SiO_2$ or the like, the edge ring requires a production cost which is about ten times that of the edge ring formed of polysilicon, $SiO_2$ or the like, because it employs high-purity SiC prepared by a CVD process, or a sintered body obtained by hot-pressing a β-SiC powder prepared by a CVD process in order to prevent metal contamination in the reaction chamber 2. Thus, the edge ring formed of SiC is significantly expensive, considering its performance.

Further, plasma resistance of the SiC prepared by a CVD process or the SiC sintered body obtained by hot-pressing a β-SiC powder prepared by a CVD process is not so high although it has ultra-high purity of 1 ppm or less, i.e., an amount of metal impurities is low by one or more digits, and is very costly. Thus, such SiC becomes a factor causing an increase in running cost.

The present invention has been made in view of solving the above conventional problem, and an object thereof to provide a SiC member capable of being produced at lower cost with high plasma resistance, and further provide a production method for the SiC member.

Solution to Technical Problem

According to a first aspect of the present invention, there is provided a silicon carbide member for a plasma processing apparatus, which consists of a sintered body of an α-silicon carbide containing metal impurities in an amount of 20 ppm or less, and an oxide-based or non-oxide-based sintering aid (appended claim 1).

Preferably, in a first specific embodiment of the first aspect of the present invention, the oxide-based sintering aid comprises $Al_2O_3$ and $Y_2O_3$, wherein a total amount of the $Al_2O_3$ and the $Y_2O_3$ is the range of 3 to 15 weight parts, and an amount of the $Y_2O_3$ is one to two times an amount of the $Al_2O_3$ (appended claim 2).

Preferably, in a second specific embodiment of the first aspect of the present invention, the non-oxide-based sintering aid contains $B_4C$ in amount of 0.5 to 5 weight parts (appended claim 3).

Preferably, in a third specific embodiment of the first aspect of the present invention, $Al_{12}Y_4O_9$ exists in a grain boundary of the α-silicon carbide crystal grain (appended claim 4).

According to a second aspect of the present invention, there is provided a method of producing a silicon carbide member for a plasma processing apparatus. The method comprises: a first step of mixing an α-silicon carbide powder and an oxide-based or non-oxide-based sintering aid together, wherein an amount of a metal impurities in the α-silicon carbide powder is reduced to 20 ppm or less; a second step of granulating the α-silicon carbide powder and the sintering aid mixed together; a third step of subjecting a granulated powder obtained in the second step to press forming; a fourth step of degreasing a shaped body obtained in the third step and then sintering the resulting degreased body in an inert gas atmosphere furnace; and a fifth step of processing a sintered body obtained in the fourth step into a silicon carbide member for a plasma processing apparatus (appended claim 5).

Preferably, in a first specific embodiment of the second aspect of the present invention, the α-silicon carbide powder has an average particle size of 0.3 to 3 μm, and the oxide-based sintering aid comprises $Al_2O_3$ and $Y_2O_3$, wherein a total amount of the $Al_2O_3$ and the $Y_2O_3$ is the range of 3 to 15 weight parts, and an amount of the $Y_2O_3$ is one to two times an amount of the $Al_2O_3$ (appended claim 6).

Preferably, in a second specific embodiment of the second aspect of the present invention, the α-silicon carbide powder has an average particle size of 0.3 to 3 μm, and the non-oxide-based sintering aid contains $B_4C$ in amount of 0.5 to 5 weight parts (appended claim 7).

Preferably, in a third specific embodiment of the second aspect of the present invention, the fourth step comprises performing the sintering at a temperature of 1850° C. to 2200° C. and at a pressure of 1 $kg/cm^2$ to 50 $kg/cm^2$, using a high-frequency heating device used in a frequency band of 1000 Hz to 5000 Hz, or at a temperature of 1850° C. to 2200° C. using an resistance heating argon atmosphere furnace (appended claim 8).

Preferably, in a fourth specific embodiment of the second aspect of the present invention, the $Al_2O_3$ has an average particle size of 0.1 to 1 μm, and the $Y_2O_3$ has an average particle size of 1 μm or less, wherein the fourth step comprises performing the sintering at a temperature of 1800° C. to 2000° C. using an argon atmosphere furnace.

Effect of Invention

In the silicon carbide member according to the first aspect of the invention or the method according to the second aspect of the invention, the silicon carbide member consists of a sintered body of an α-silicon carbide containing metal impurities such as iron in an amount of 20 ppm or less, and an oxide-based or non-oxide-based sintering aid. Thus, it becomes possible to produce the silicon carbide member with high plasma resistance at low cost without any adverse influence of the metal impurities on a plasma processing apparatus.

This makes it possible to improve durability of an edge ring or other member for use in various plasma processing apparatuses and realize mass production and cost reduction thereof.

In the first specific embodiment of the first aspect of the present invention or the first specific embodiment of the second aspect of the present invention, the oxide-based sintering aid comprises $Al_2O_3$ and $Y_2O_3$, wherein a total amount of the $Al_2O_3$ and the $Y_2O_3$ is the range of 3 to 15 weight parts, and an amount of the $Y_2O_3$ is one to two times an amount of the $Al_2O_3$. Thus, in addition to the above advantageous effect, it becomes possible to further improve the plasma resistance.

In the second specific embodiment of the first aspect of the present invention or the second specific embodiment of the second aspect of the present invention, the non-oxide-based sintering aid contains $B_4C$ in amount of 0.5 to 5 weight parts. Thus, in addition to the above advantageous effect, it becomes possible to further improve the plasma resistance.

In the third specific embodiment of the first aspect of the present invention, $Al_{12}Y_4O_9$ exists in a grain boundary of the α-silicon carbide crystal grain. Thus, in addition to the above advantageous effect, it becomes possible to provide better properties in the silicon carbide member.

In the third specific embodiment of the second aspect of the present invention, the sintering is performed at a temperature of 1850° C. to 2200° C. and at a pressure of 1 kg/cm² to 50 kg/cm², using a high-frequency heating device used in a frequency band of 1000 Hz to 5000 Hz, or at a temperature of 1850° C. to 2200° C. using an resistance heating argon atmosphere furnace. Thus, in addition to the above advantageous effect, it becomes possible to obtain a more dense sintered body and provide better plasma resistance in the sintered body.

In the fourth specific embodiment of the second aspect of the present invention, the $Al_2O_3$ and the $Y_2O_3$ have, respectively, an average particle size of 0.1 to 1 μm and an average particle size of 1 μm or less, and the sintering is performed at a temperature of 1800° C. to 2000° C. using an argon atmosphere furnace. Thus, in addition to the above advantageous effect, it becomes possible to provide better bonding between grains and provide better plasma resistance in the sintered body.

DESCRIPTION OF EMBODIMENTS

The present invention will now be described based on various Examples (production process of an edge ring).

Figure 2:
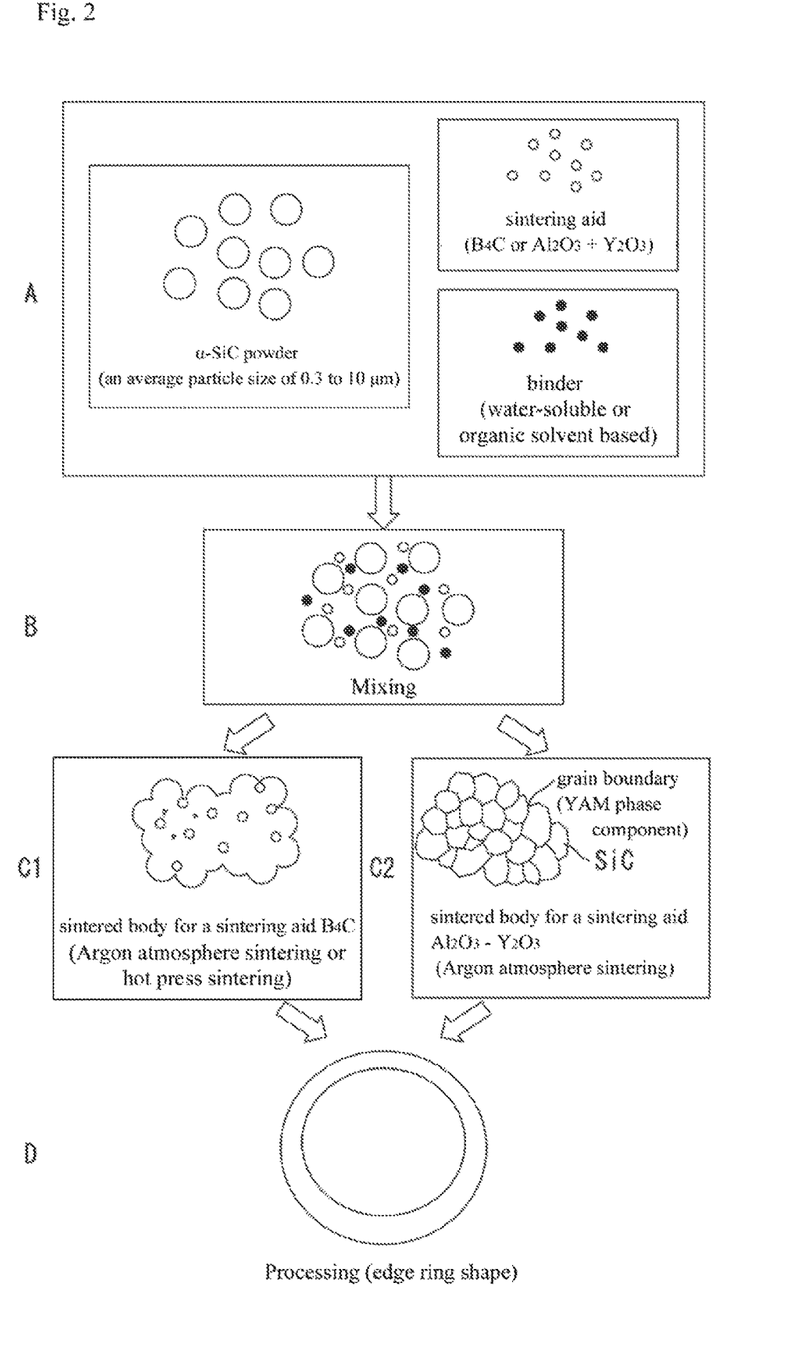
FIG. 2 is a conceptual diagram depicting a production process of an edge ring in Examples.

FIG. 2 is a conceptual diagram depicting a production process of an edge ring in Examples of the present invention.

Example 1

<First Step> (FIG. 2A)

As a primary raw material, α-SiC particles (purity: about 98%) having an average particle size of 0.6 μm were employed, wherein the α-SiC particles was subjected to chemical cleaning to enable impurities therein, such as elements of groups IV to VIII of the 4th rows of the periodic table including iron (Fe) as a representative impurity among metal impurities, and oxides, carbides, nitrides, borides or the like of the elements, to becomes 20 ppm or less, and enable free $SiO_2$ components to become 0.3% or less.

Then, as a sintering aid for α-SiC particles, a $B_4C$ raw material powder having a purity of 99% or more and an average particle size of 1 μm or less was prepared.

$B_4C$ as a sintering aid was added to the above α-SiC raw material powder in respective amounts of 3 weight parts, 2 weight parts and 1 weight part to prepare three types of mixed powders, and then 3 weight parts of acrylic-based water-soluble binder as a shaping aid, and pure water as a solvent, were added to respective ones of the mixed powders to prepare three types of mixtures.

<Second Step> (FIG. 2B)

Each of the mixtures was subjected to pulverization using a ball mill pot made of nylon and nylon-coated balls to prepare a slurry, and a granulated powder was prepared from the slurry by using a spray dryer. Further, the granulated powder was subjected to press-forming at a pressing force of 1000 kg/cm² to prepare three types of 50 mm-square test pieces.

<Third Step> (FIG. 2C1)

The three types of test pieces were heated and degreased in a vacuum atmosphere, and, after being putting into an argon (Ar) atmosphere furnace, sintered at a temperature of 2160° C. to obtain three types of sintered bodies.

As a result of measuring the density of each of these sintered bodies, it was proven that each of the test pieces was formed as a dense sintered body having a density with respect to a theoretical density (relative density) of 98.5% or more.

<Fourth Step> (FIG. 2D)

An edge ring having an outer diameter of about 350 mm, an inner diameter of about 295 mm, and a thickness of about 5 mm can be produced by processing the sintered body having a size appropriate to this dimension.

Example 2

<First Step> (FIG. 2A)

The same α-SiC raw material powder as that used in Example 1, and a fine $Al_2O_3$ powder having a purity of 99.99% or more and an average particle size of 0.5 μm as one component of the sintering aid for α-SiC were preliminarily prepared.

A fine $Y_2O_3$ powder having a purity of 99.9% or more and an average particle size of 1 μm or less as another component of the sintering aid for α-SiC was also preliminarily prepared.

Further, fine $Al_2O_3$ and $Y_2O_3$ powders each having an average particle size of 0.5 μm or less were preliminarily prepared.

3 weight parts of acrylic-based water-soluble binder as a shaping aid and pure water as a solvent were added to a mixture with respect to 100 weight parts of the mixture, wherein the mixture consists of 100 weight parts of the α-SiC raw material powder, and the $Al_2O_3$ raw material powder and the $Y_2O_3$ raw material powder each added to the α-SiC raw material powder in a respective one of amounts of 2.5 weight parts and 5 weight parts with respect to and in addition to 100 weight parts of the α-SiC raw material powder.

<Second Step> (FIG. 2B)

As with Example 1, each of the two types of mixtures was subjected to pulverization to prepare a slurry, and a granulated powder was prepared from the slurry by using a spray dryer. Further, the granulated powder was subjected to press-forming at a pressing force of 1000 kg/cm² to prepare two types of 50 mm-square test pieces.

<Third Step> (FIG. 2C2)

The test pieces were heated and degreased in a vacuum atmosphere, and, after being putting into an argon (Ar) atmosphere high-frequency induction heating furnace, sintered at a temperature of 2160° C. to obtain two types of sintered bodies.

As a result of measuring the density of each of the sintered bodies, it was proven that each of the test pieces was formed as a dense sintered body having a specific gravity of 3.16.

Further, the shaped body using the fine $Al_2O_3$ and $Y_2O_3$ powders each having an average particle size of 0.5 μm was sintered at a temperature of 1850 to 1900° C. in a resistance heating Ar atmosphere furnace to obtain a dense sintered body having a specific gravity of 3.18.

<Fourth Step> (FIG. 2D)

An edge ring having an outer diameter of about 350 mm, an inner diameter of about 295 mm and a thickness of about 5 mm can be produced by processing the sintered body having a size appropriate to this dimension.

Example 3

<First Step> (FIG. 2A)

$B_4C$ as a sintering aid was added to the same α-SiC raw material powder as that used in Example 1, in an amount of 1.5 weight parts to prepare a mixed powder, and then a methanol solvent was added to the mixed powder without adding any shaping aid to prepare a mixture.

<Second Step> (FIG. 2B)

As with Example 1, the mixture was subjected to pulverization to prepare a slurry, and the slurry was dried to prepare a shaping powder so as to prepare a 50 mm-square test piece.

<Third Step> (FIG. 2C1)

The test piece was sintered by hot pressing under conditions comprising a pressurizing force of 200 kg/cm² and a temperature of 2100° C., to obtain a sintered body.

As a result of measuring the density of the obtained sintered body, it was proven that the test piece was formed as a dense sintered body having a specific gravity of 3.193 (relative density: 99.8%).

<Fourth Step> (FIG. 2D)

An edge ring having an outer diameter of about 350 mm, an inner diameter of about 295 mm, and a thickness of about 5 mm can be produced by processing a sintered body having a size appropriate to this dimension.

In Table 1, two currently commonly-used edge ring members (Sample Nos. #1 and #2: using β-SiC as a primary raw material) produced by a CVD process and the sintered bodies prepared in Examples 1 to 3 (Sample Nos. #3, #4 and #5: using α-SiC as a primary raw materials) were compared in terms of production process, sintering aid, plasma resistance, surface roughness, impurities and electric resistivity.

In the plasma resistance test, a small piece sample having a sample area of 20×20 mm and a thickness of 5 mm was exposed to plasma by an inductively coupled type RIE apparatus (Centura-DPS manufactured by Applied Material Co., Ltd.) for a 200 mm wafer. Plasma resistance was checked by weight change before and after etching. As to the plasma irradiation conditions, using the source power: 1600 W (frequency: 13.56 MHz), bias power: 30 W (frequency: 13.56 MHz), and SF6 gas, plasma exposure was carried out for 5 hours under the conditions comprising gas flow rate: 180 sccm and pressure: 15 mTorr. Plasma irradiation for 30 minutes was carried out 10 times because it is difficult to irradiate plasma for a long time.

Here, Sample No. #3 (sintered body) was obtained by adding 1 weight part of $B_4C$ which is a sintering aid in Example 1, and Sample No. #4 (sintered body) and Sample No. #5 (sintered body) were obtained, respectively, in Example 2 and in Example 3.

TABLE 1

| sample | production process | sintering aid | plasma resistance (weight change) amount of weight loss (mg) | exchange rate (μm/h) | surface roughness (Ra) before plasma irradiation (μm) | after plasma irradiation (μm) | impurities concentrations (ppm) | electric resistivity (Ω · cm) |
|---|---|---|---|---|---|---|---|---|
| No.1 CVD-SiC | CVD | — | 59.9 | 9.4 | 0.41 | 1.43 | less than 1 | $1.6 \times 10^6$ |
| No.2 CVD-SiC | CVD | — | 63.7 | 9.6 | 0.21 | 0.16 | less than 1 | — |
| No.3 sintered body SiC | Argon Sintering | B based | 36.9 | 5.9 | 0.06 | 1.17 | B:3300 | $1.0 \times 10^8$ |
| No.4 sintered body SiC | High-frequency Sintering | Al based Y based | 9.3 | 1.5 | 0.14 | 0.95 | Al:17000, Y:5300 | $1.7 \times 10^4$ |
| No.5 sintered body SiC | Hot Press Sintering | B based | 53.9 | 8.5 | 0.04 | 1.88 | B:2400 | $6.0 \times 10^7$ |

Figure 3:
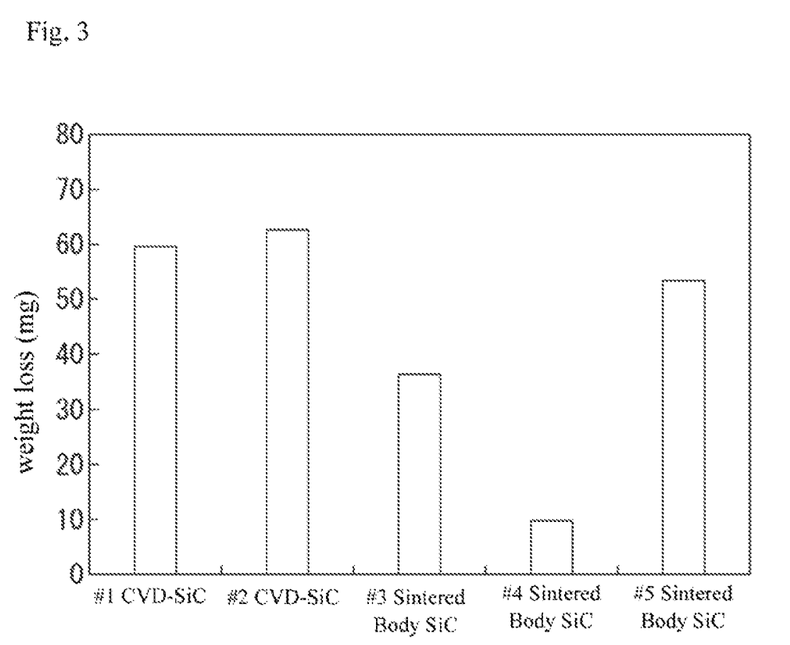
FIG. 3 is a graph presenting the amount of weight loss after plasma irradiation (post-plasma irradiation weight loss) in each of currently commonly-used members and sintered bodies according to the present invention.

FIG. 3 is a graph presenting an amount of weight loss after plasma irradiation (post-plasma irradiation weight loss) in each of Sample Nos. #1 and #2 SiC produced by the CVD process (hereinafter referred to as "CVD-SiC") and Sample Nos. #3, #4 and #5, the sintered bodies obtained in Examples 1 to 3. And FIG. 4 is a graph presenting surface roughness before and after plasma irradiation (pre- and post-plasma irradiation surface roughness) in each of Sample Nos. #1 and #2 (CVD-SiCs) and Sample Nos. #3, #4 and #5 (sintered bodies) obtained in Examples 1 to 3.

Of these, Sample Nos. #1 and #2 are CVD-SiC which have been practically used in recent years by carefully selecting various materials, because the SiC sintered body as disclosed in Patent Document 2 and the like is insufficient in terms of furnace contamination and plasma resistance.

Figure 4:
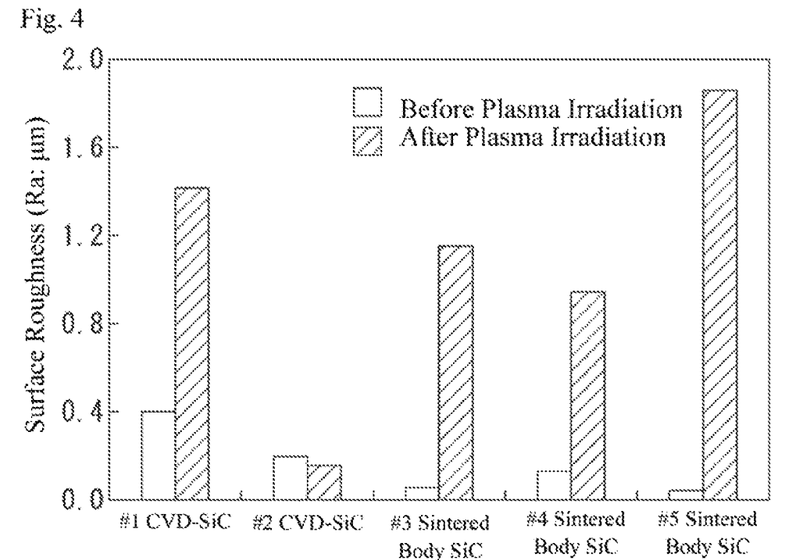
FIG. 4 is a graph presenting surface roughness before and after plasma irradiation (pre- and post-plasma irradiation surface roughness) in each of the currently commonly-used members and the sintered bodies according to the present invention.

Table 1 and FIGS. 3 and 4 show that Sample Nos. #3, #4 and #5 (sintered bodies) are all extremely excellent in plasma resistance, and are also superior to the currently commonly-used Sample Nos. #1 and #2 (CVD-SiCs) in terms of surface roughness before plasma irradiation.

Furthermore, these are show that, as to Sample No. #3 (sintered body), the amount of weight loss is about 60% as compared with that of Sample Nos. #1 and #2 (CVD-SiCs), and thereby durability is improved to about 1.5 times, and, as to Sample No. #4 (sintered body), the amount of weight loss is less than 20% as compared with that of the same Sample Nos. #1 and #2 (CVD-SiCs), and thereby durability is significantly improved to 5 times or more.

The above high plasma resistance is obtained, probably because, in Sample Nos. #3 and #5 (sintered bodies), the sintering aid $B_4C$ firmly bonds crystal grains to each other, and, in Sample No. #4 (sintered body), a YAM phase component ($Al_{12}Y_4O_9$) generated by the sintering aids $Al_2O_3$ and $Y_2O_3$ exists in a crystal grain boundary, and the α-SiC crystals having dielectric anisotropy are aligned in crystal orientation and densified by the electric field applied during high-frequency induction heating.

From Table 1 and FIG. 4, the Sample Nos. #3 and #4 (sintered bodies) are considered to be at the same level as the CVD-SiCs in terms of surface roughness after plasma irradiation. As to Sample No. #5 (sintered body), although the surface roughness after plasma irradiation is higher than that of the CVD-SiCs, it is considered that there is no problem for use as an edge ring, probably because Ra is less than 2 μm and is not extremely high.

As to the impurity concentrations, all Sample Nos. #3, #4 and #5 (sintered bodies) have high concentrations of impurities derived from the sintering aid (the concentration of Boron (B) in Sample Nos. #3 and #5 (sintered bodies), and the concentrations of aluminum (Al) and yttrium (Y) in Sample No. #4 (sintered body). However, these impurities exist in a crystal grain boundary and are firmly bonded with crystal grains, and therefore do not become a source of generation of chamber contamination which causes a problem in plasma processing.

In addition, Al and Y are used as an inner wall material for a plasma processing apparatus, and B has also been used recently for a carbon type CVD film used as a mask material. Thus, considering above, as long as the impurity concentrations are at the above level, there might be no problem in semiconductor production.

Furthermore, as a result of separately measuring the impurity concentrations of iron (Fe) and nickel (Ni) which are most problematic in the plasma processing, these impurity concentrations were 0.005 ppm and 0.014 ppm for Sample No. #1 (the CVD-SiC), 0.002 ppm or less and 0.034 ppm for Sample No. #2 (the CVD-SiC), 0.044 ppm and 0.04 ppm for Sample No. #3 (sintered body), 3.9 ppm and 1.4 ppm for Sample No. #4 (sintered body), and 3.9 ppm and 5 ppm for Sample No. #5 (sintered body), respectively.

These impurity concentrations of Sample Nos. #3, #4 and #5 (sintered bodies) are higher than those of two Sample Nos. #1 and #2 (CVD-SiCs). However, these impurity concentrations are equal to or lower than those of the yttria ($Y_2O_3$) film used as the inner wall material for a plasma processing apparatus, and therefor are not at a level causing particular problems on practical use.

Indeed, although the Sample Nos. #3, #4 and #5 (sintered bodies) have more impurities than Sample Nos. #1 and #2 (CVD-SiCs), which have remarkably fewer impurities, it was ascertained that these exhibit particularly excellent result in terms of plasma resistance. Further, it was ascertained that these impurities does not at all exert an influence on the yield of device production.

Incidentally, ferrous impurity in raw material powder of commercially available α-SiC are usually on the order of one to several hundred ppm. The raw material powder of α-SiC used in the present invention is subjected to chemical cleaning to enable the content of ferrous impurity to become 20 ppm or less. Thus in the sintered bodies thereof, the content of ferrous impurity becomes a smaller value.

This is probably because impurities on the surface of the crystal grain are separated and evaporated at the time of sintering. Particularly, in Sample No. #4 (sintered body), it is believed that ferrous impurity is easily separated due to high-frequency induction heating.

As to electric resistivity, it was $1.0 \times 10^8$ Ω·cm or more for Sample No. #3 (sintered body), $1.7 \times 10^4$ Ω·cm for Sample No. #4 (sintered body), and $6.0 \times 10^7$ Ω·cm for Sample No. #5 (sintered body). Compared with two Sample Nos. #1 and #2 (CVD-SiCs member), Sample Nos. #3 and #5 (sintered bodies) had relatively high electric resistivity, and Sample No. #4 (sintered body) had an order of magnitude lower electric resistivity.

Taken together, Sample Nos. #3, #4 and #5 (sintered bodies) are suitable materials for the edge rings. Particularly, Sample No. #4 (sintered body) has a particularly excellent property in terms of plasma resistance as compared with Sample Nos. #1 and #2 (CVD-SiCs), and also has superior property in terms of surface roughness and electrical resistivity before and after plasma irradiation. Therefore, it can be considered to be a very suitable material for an edge ring.

Although Sample Nos. #3 and #5 (sintered bodies) are inferior to Sample No. #4 (sintered body) in plasma resistance, they have higher plasma resistance than that of Sample Nos. #1 and #2 (CVD-SiCs) and are inexpensive to manufacture, and thus can be suitably used as an edge ring. In addition, although these are limited in application due to high electrical resistivity, on the contrary, they can be considered to be very suitable materials for members for a plasma processing apparatus which are required to have high electric resistivity.

Example 4

100 weight parts of the same α-SiC raw material powder as that used in Example 1, 3.5 weight parts of $Al_2O_3$ powder and 7 weight parts of $Al_2O_3$ powder were mixed to prepare a mixture, wherein the $Al_2O_3$ powder having a purity of 99.9% and an average particle size of 1 am and the $Y_2O_3$ powder having a purity of 99.9% and an average particle size of 1 μm, and the obtained mixture was granulated to prepare a granulated powder. Further, the obtained granulated powder was subjected to press-forming at a pressing force of 1 ton/cm² to prepare a shaped body, degreasing the obtained shaped body and then sintering the resulting degreased body in a resistance heating Ar atmosphere furnace at a temperature of 1800 to 1900° C. to produce an edge ring having a specific gravity of 3.15 and an electric resistivity of $7\times10^5$ Ω·cm.

Crystal structure analysis by X-ray diffraction was carried out to check the material property of this edge ring. The X-ray diffraction chart is presented in FIG. 5.

Figure 5:
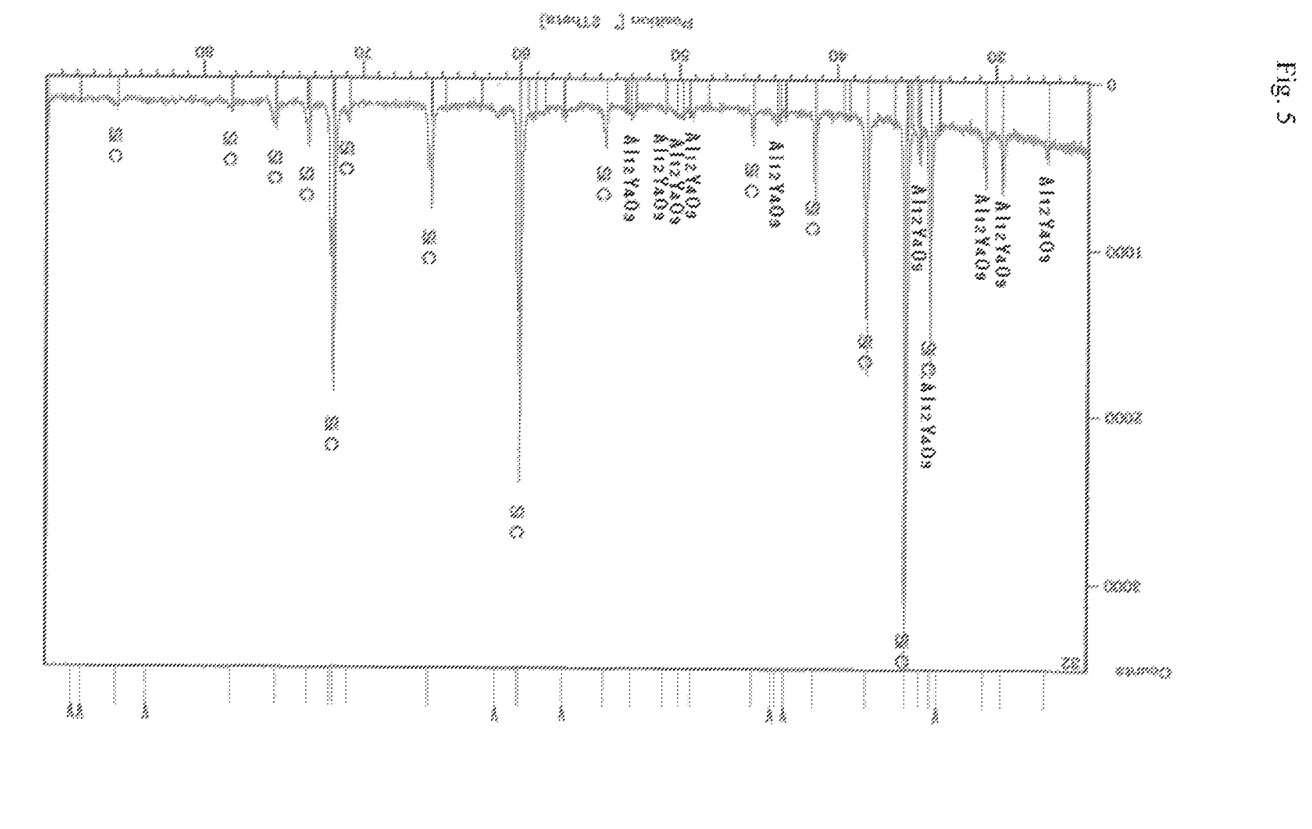
FIG. 5 is an X-ray diffraction chart of an α-SiC sintered body according to the present invention, wherein the α-SiC sintered body uses $Al_2O_3$ and $Y_2O_3$ as a sintering aid.

This X-ray diffraction chart shows that the peak of the SiC component, and the peak of the YAM phase component ($Al_{12}Y_4O_9$) generated from the sintering aid comprising $Al_2O_3$ and $Y_2O_3$, are present.

As a result of detailed crystal structure analysis by X-ray diffraction, it was ascertained that $Y_2O_3$ component existed slightly.

Therefore, it can be said that the α-SiC sintered body of the present invention has a microstructure in which $Al_2O_3$ and $Y_2O_3$ added as a sintering aid are compounded as $Al_{12}Y_4O_9$ in the SiC crystal grain boundary during sintering process.

In the α-SiC raw material powder used in the present invention, the free $SiO_2$ contained in the SiC raw material is reduced to 0.3% or less. As a result, almost no $SiO_2$, which is not so excellent in plasma resistance, is present in the sintered body material. Furthermore, the α-SiC raw material powder used in the present invention can produce the α-SiC sintered body in which mullite component having several times the molecular weight of $SiO_2$ such as $3Al_2O_3 \cdot 2SiO_2$ to $2Al_2O_3 \cdot SiO_2$ or $Al_6O_{13}Si_{12}$ is not generated in a large amount even if $SiO_2$ react with $Al_2O_3$ added as a sintering aid.

Next, using a conventional edge ring currently commonly used as a genuine (standard) product and an inventive edge ring produced in Example 4, a plasma etching test was conducted under the following conditions.

In an inductively coupled type plasma etching apparatus for an 8 inch wafer, $Ar/CF_4$ was flowed at 20/10 sccm, and a multilayered film of the silicon oxide film and the polysilicon film was etched at a pressure of 1 Pa to form holes.

For plasma excitation, electric power of 2000 W at 13.56 MHz was applied to an antenna, and electric power of 1000 W at 13.56 MHz was applied to a substrate on which a silicon wafer was placed.

This structure can be suitably used to form a vertical gate for a three-dimensional NAND flash memory.

In addition, the edge ring produced in present Example is excellent in terms of plasma resistance as compared with the conventional edge ring. This reduces the amount of SiC components gasified and released into the gas phase during the etching.

Figure 6:
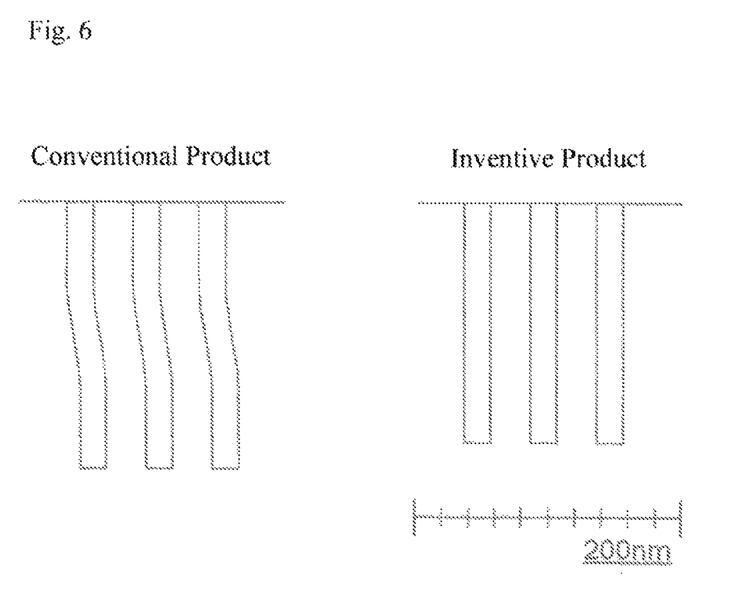
FIG. 6 is a view depicting a sectional shape of a hole formed in a multilayered film by etching using a conventional edge ring currently commonly used as a genuine (standard) product and an inventive edge ring formed of a sintered body according to the present invention.

FIG. 6 is a view depicting a sectional shape of a hole formed in this way, where the left side depicts a sectional shape of the hole formed by using the conventional edge ring, and the right side depicts a sectional shape of the hole formed by using an edge ring formed of the sintered body produced in Example 4 of the present invention.

As can be seen from FIG. 6, the conventional SiC edge ring as the genuine product is etched with F-base radicals, and then the radicals are gasified into $SiF_4$, $CF_4$ or the like and discharged from the edge ring. As such, the density and electric potential of the plasma have been different between the center of the wafer and the periphery of the wafer close to the edge ring.

For this reason, abnormality in the etching shape occurred only at the periphery of the wafer, so that control of fine dimensions became difficult, and the yield after etching has been deteriorated.

On the other hand, in the sintered body according to the present invention, the rate of gasification of the edge ring by the plasma became smaller as compared with that of the conventional edge ring, so that the distributions of plasma density and electric potential became uniform.

As a result, as shown in FIG. 6, it was possible to form vertical holes, and to suppress occurrence of abnormality in the etching shape. This also improved process yield.

Such an advantageous effect is not limited to the above process and the etching apparatus used.

In recent years, development and improvement of semiconductors has progressed toward increasingly miniaturization, and it is aimed at forming the groove width of plasma etching to 10 nm or less.

Accuracy of an etching pattern is essential to miniaturization of semiconductors, and exerts a great influence on the yield of semiconductor production. The present invention makes it possible to improve the yield of production.

Modifications of the Examples will be listed below.

(1) In Examples 1 to 4, the α-SiC particles having an average particle size of 0.6 μm was employed. However it found that it is possible to obtain a sintered body having equivalent properties as long as the average particle size of the α-SiC is a range of 0.3 to 5 μm, and to obtain a dense sintered body as long as the average particle size of is a range of 0.3 to 3 μm.

(2) In Examples 1 and 3, the $B_4C$ raw material powder having an average particle size of 1 μm or less was employed as a sintering aid, and in Example 2, the fine $Al_2O_3$ powder having an average particle size of 0.5 μm and the fine $Y_2O_3$ powder having an average particle size of 1 μm or less were employed as a sintering aid.

However, as a result of repeated experiments, it found that it is possible to obtain a sintered body having equivalent properties as long as the average particle size of $B_4C$ is a range of 0.3 to 3 μm, and to obtain more dense sintered body as long as the average particle size of $B_4C$ is a range of 0.3 to 1 μm.

Further, it is possible to obtain a sintered body having equivalent properties as long as each of the average particle sizes of the fine $Al_2O_3$ powder and the fine $Y_2O_3$ powder is, respectively, a range of 0.3 to 5 μm, and to obtain a dense sintered body as long as each of the average particle sizes is, respectively, a range of 0.3 to 2 μm. Further, by employing the fine powders having the average particle sizes of 1 μm or less, it is possible to obtain a sintered body having a low temperature sinterability.

(3) In Example 1, the $B_4C$ as a sintering aid was added to the α-SiC raw material powder in amount of 1 to 3 weight parts. In Example 2, 2.5 weight parts of the $Al_2O_3$ raw material powder and 5 weight parts of the $Y_2O_3$ raw material powder were each added to 100 weight parts of the α-SiC raw material powder. In Example 3, the $B_4C$ as a sintering aid was added to the α-SiC raw material powder in amount of 1.5 weight parts. And in Example 4, 3.5 weight parts of the $Al_2O_3$ raw material powder and 7 weight parts the $Y_2O_3$ raw material powder were each added to 100 weight parts of the α-SiC raw material powder.

However, as a result of repeated experiments, when using $B_4C$ as a sintering aid, it was found that a mixing amount of $B_4C$ raw material powder added with respect to total amount of the α-SiC raw material powder and the $B_4C$ raw material powder is preferably a range of 0.5 to 5 weight parts, and more preferably a range of 1 to 2 weight parts.

Further when using the $Al_2O_3$ and the $Y_2O_3$ as a sintering aid, it was found that a total mixing amounts of the $Al_2O_3$ raw material powder and the $Y_2O_3$ raw material powder added to 100 weight parts of the α-SiC raw material powder were preferably a range of 3 to 15 weight parts, and more preferably a range of 6 to 12 weight parts.

A mixing ratio of $Al_2O_3$ and $Y_2O_3$ was 1:2 in Example 2. However, Yam phase component represented by the structural formula of $Al_{12}Y_4O_9$ exists in a crystal grain boundary, and an element weight ratio of Al×12 element to Y×4 element is 1:1.098. Therefore, the mixing weight of $Y_2O_3$ is preferably 1.1 times or more of that of $Al_2O_3$.

(4) In Example 1, sintering (Argon Sintering) was carried out using $B_4C$ as a sintering aid in the argon atmosphere furnace. In Example 2, sintering (High-frequency Sintering) was carried out using $Al_2O_3$ and $Y_2O_3$ as a sintering aid in the high-frequency induction heating furnace. In Example 3, sintering (Hot Press Sintering) was carried out by the hot press using $B_4C$ as a sintering aid. In Example 4, sintering (Argon Sintering) was carried out using $Al_2O_3$ and $Y_2O_3$ as a sintering aid. However, high-frequency sintering may be performed using $B_4C$ as a sintering aid, or hot press sintering may be performed using $Al_2O_3$ and $Y_2O_3$ as sintering aids.

In addition, Sample No. #4 (sintered body) produced in Example 2 has particularly excellent properties including plasma resistance and electric conductivity, probably because the α-SiC crystals having dielectric anisotropy is aligned in crystal orientation and densified by the electric field applied during high-frequency induction heating. The α-SiC crystals also have magnetic anisotropy, so that it is also considered to enable to obtain the equivalent effect by a magnetic field. Therefore, it may be sintered in a strong magnetic field.

(5) The electrical resistivities of Sample Nos. #3, #4 and #5 (sintered bodies) are as shown in Table 1. The electrical resistivities of Sample Nos. #4 and #5 (sintered bodies) were $1.7\times10^4$ Ω·cm and $6.0\times10^7$ Ω·cm, respectively. It was shown that each of Sample Nos. #3 and #5 (sintered bodies) using $B_4C$ as a sintering aid tended to have higher electrical resistivity than Sample No. #4 (sintered body).

However, an edge ring adequately functions as long as electrical resistivity is $1\times10^8$ Ω·cm or less.

(6) Although the measured values of the thermal conductivity are not shown in Table 1, the thermal conductivities of Sample Nos. #3, #4 and #5 (sintered bodies) were a range of 100 to 250 W/m·K. Although the range of the thermal conductivities of these sintered bodies were lower than that of 200 to 250 W/m·K of the CVD-SiC, it is considered that these sintered bodies function satisfactorily as an edge ring as long as the thermal conductivity is 40 W/m·K or more. Further, in the case of an apparatus in which the edge ring is placed on a member having poor thermal conductivity such as quartz, even if the thermal conductivity of the sintered bodies is worse than this, these sintered bodies can be suitably used for an edge ring.

(7) As to the sintering process, the SiC member sintered in an inert atmosphere furnace is further subjected to HIP processing, and thereby it is possible to obtain a dense sintered body having very few holes.

For example, a SiC member was obtained by adding 1.5 weight parts of $B_4C$ and sintering in an inert atmosphere furnace to have a specific gravity of 3.144 (relative density of 97.9%), and this obtained SiC member was further subjected to HIP processing at 2000 atmospheric pressure and 2000° C. for 1.5 hours. As a result, the resulting SiC member could be densified to have the specific gravity of 3.185 (relative density 99.3%).

Although Ar is used as the atmospheric gas during high-temperature sintering of the SiC member of the present invention, an inert gas other than Ar, or non-oxidizing atmosphere gas can also be used.

LIST OF REFERENCE SIGNS

1: semiconductor wafer
2: reaction chamber
3: shower head type upper electrode
4: lower electrode
5: hollow portion
6: gas supply hole
7: exhaust plate
8: electrostatic chuck
9: edge ring
10: high-frequency power supply

The invention claimed is:

1. A silicon carbide member for a plasma processing apparatus, consisting of a sintered body of an α-silicon carbide containing metal impurities in an amount of 20 ppm or less, and an oxide-based sintering aid, wherein $Al_{12}Y_4O_9$ exists in a grain boundary of an α-silicon carbide crystal grain.

* * * * *